US012571852B2

(12) United States Patent
Son et al.

(10) Patent No.: US 12,571,852 B2
(45) Date of Patent: Mar. 10, 2026

(54) BATTERY LIFE PREDICTION APPARATUS AND METHOD

(71) Applicant: LG ENERGY SOLUTION, LTD., Seoul (KR)

(72) Inventors: Su Bin Son, Daejeon (KR); Jeong Seok Park, Daejeon (KR); Jong Soo Lee, Daejeon (KR); Hyun Chul Ahn, Daejeon (KR); Sang Heon Han, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 441 days.

(21) Appl. No.: 17/922,759

(22) PCT Filed: Aug. 9, 2021

(86) PCT No.: PCT/KR2021/010476
§ 371 (c)(1),
(2) Date: Nov. 1, 2022

(87) PCT Pub. No.: WO2022/035152
PCT Pub. Date: Feb. 17, 2022

(65) Prior Publication Data
US 2023/0176136 A1 Jun. 8, 2023

(30) Foreign Application Priority Data

Aug. 13, 2020 (KR) ........................ 10-2020-0101865

(51) Int. Cl.
*G01R 31/392* (2019.01)
*G01R 31/367* (2019.01)

(52) U.S. Cl.
CPC ......... *G01R 31/392* (2019.01); *G01R 31/367* (2019.01)

(58) Field of Classification Search
None
See application file for complete search history.

(56) References Cited

U.S. PATENT DOCUMENTS

2008/0288425 A1* 11/2008 Posse ...................... G06N 5/02
706/12
2013/0268466 A1 10/2013 Baek et al.
2015/0046107 A1 2/2015 Jo
(Continued)

FOREIGN PATENT DOCUMENTS

CN 106649962 A 5/2017
EP 2921870 A1 9/2015
(Continued)

OTHER PUBLICATIONS

Extended European Search Report for European Application No. 21856158.7, dated Dec. 11, 2023.
(Continued)

*Primary Examiner* — Raymond L Nimox
(74) *Attorney, Agent, or Firm* — Birch, Stewart, Kolasch & Birch, LLP

(57) ABSTRACT

A battery life prediction apparatus including a storing unit storing a plurality of pieces of power pattern data used in an actual site, a pattern generating unit generating a test pattern for predicting a life of a battery based on the power pattern data, and a life predicting unit predicting a residual life of the battery based on the test pattern.

16 Claims, 7 Drawing Sheets

(56) References Cited

U.S. PATENT DOCUMENTS

| | | |
|---|---|---|
| 2015/0369874 A1 | 12/2015 | Park et al. |
| 2016/0041231 A1 | 2/2016 | Lee |
| 2017/0182906 A1 | 6/2017 | Park et al. |
| 2019/0111800 A1 | 4/2019 | Remboski et al. |
| 2019/0113578 A1 | 4/2019 | Um et al. |
| 2020/0191876 A1 | 6/2020 | Shin et al. |

FOREIGN PATENT DOCUMENTS

| | | | | |
|---|---|---|---|---|
| JP | 2012-172991 | A | 9/2012 | |
| JP | 2018-169161 | A | 11/2018 | |
| JP | 2020-63920 | A | 4/2020 | |
| JP | 6835273 | B1 | 2/2021 | |
| KR | 10-2013-0113296 | A | 10/2013 | |
| KR | 10-2015-0040124 | A | 4/2015 | |
| KR | 10-2016-0000317 | A | 1/2016 | |
| KR | 10-2016-0017416 | A | 2/2016 | |
| KR | 10-2016-0030643 | A | 3/2016 | |
| KR | 10-2016-0128000 | A | 11/2016 | |
| KR | 10-2017-0028183 | A | 3/2017 | |
| KR | 10-2017-0044415 | A | 4/2017 | |
| KR | 10-2017-0076414 | A | 7/2017 | |
| KR | 10-2018-0102882 | A | 9/2018 | |
| KR | 10-2019-0041360 | A | 4/2019 | |
| KR | 10-1988623 | B1 | 6/2019 | |
| KR | 10-2019-0115937 | A | 10/2019 | |
| KR | 2019115937 | A * | 10/2019 | ......... G01R 31/3648 |
| KR | 10-2140632 | B1 | 8/2020 | |
| WO | WO 2018/195049 | A1 | 10/2018 | |
| WO | WO 2019/079234 | A1 | 4/2019 | |

OTHER PUBLICATIONS

Rubenbauer et al., "Definitions and reference values for battery systems in electrical power grids", Online, 2017.

Sulzer et al., "The challenge and opportunity of battery lifetime prediction from field data", Joule, vol. 5, No. 8, Aug. 18, 2021, pp. 1934-1955.

International Search Report (PCT/ISA/210) issued in PCT/KR2021/010476, dated Nov. 22, 2021.

* cited by examiner

200

| STORING UNIT | 210 |
| PATTERN GENERATING UNIT | 220 |
| LIFE PREDICTING UNIT | 230 |

PNNL(Raw pattern)

| Optimization | | | Input | Output |
|---|---|---|---|---|
| Sampling Time | | 4 sec | | |
| | Normalized | Scale-Changed | Final | Target |
| Max SOE | 56.01 | 55.94 | 82.08 | 80.00 |
| Min SOE | 44.05 | 10.90 | 20.44 | 20.00 |
| First SOE | 50.00 | 50.00 | 50 | 50 |
| Last SOE | 50.00 | 18.24 | 50.05 | 50.00 |
| Average CP | 4.30 | 0.5783 | 0.5091 | 0.5000 |

Factor(Input, Output)

FIG.4

BATTERY LIFE PREDICTION APPARATUS AND METHOD

CROSS-REFERENCE TO RELATED APPLICATION

This application claims priority to and the benefit of Korean Patent Application No. 10-2020-0101865 filed in the Korean Intellectual Property Office on Aug. 13, 2020, the entire contents of which are incorporated herein by reference.

TECHNICAL FIELD

The present invention relates to an apparatus and method for predicting a life of a battery by generating a pattern for testing charging and discharging of the battery.

BACKGROUND ART

Recently, research and development of secondary batteries have been actively performed. Herein, the secondary batteries, which are chargeable/dischargeable batteries, may include all of conventional nickel (Ni)/cadmium (Cd) batteries, Ni/metal hydride (MH) batteries, etc., and recent lithium ion batteries. Among the secondary batteries, a lithium ion battery has a much higher energy density than those of the conventional Ni/Cd batteries, Ni/MH batteries, etc. Moreover, the lithium ion battery may be manufactured to be small and lightweight, such that the lithium ion battery has been used as a power source of mobile devices. In addition, the lithium ion battery is attracting attention as a next-generation energy storage medium as a usage range thereof is expanded to a power source of electric vehicles.

Furthermore, the secondary battery is generally used as a battery pack including a battery module where a plurality of battery cells are connected to one another in series and/or in parallel. The battery pack may be managed and controlled by a battery management system in terms of a state and an operation thereof.

Meanwhile, an energy storage system (ESS) performs a test in the form of repeating the same cycle in prediction of a residual rate of a battery through charging and discharging cycles, such that accuracy is degraded in application to an actual site where unidentical cycles are used in a mixed manner. For example, such a conventional scheme conducts a residual rate test while changing a CP rate in a battery voltage range of 3V to 4.2V, and predicts a residual rate (life) of the actual site by using data derived from the test.

However, in the actual site, charging and discharging are performed with the real-time change of the CP rate, such that a predicted residual rate calculated by using residual rate data based on a conventional test repeating the same cycle in a mixed manner may be quite different from an actual residual rate based on a pattern used in the actual site.

DISCLOSURE OF THE INVENTION

Technical Problem

The present invention has been designed to solve the foregoing problems, and aims to provide a battery life prediction apparatus and method in which by generating a test pattern to have a parameter value desired by a user based on power pattern data used in an actual site, a charging/discharging test may be conducted through a power pattern that is similar to the actual site, thereby improving the accuracy of battery residual rate prediction of the actual site.

Technical Solution

According an embodiment of the present invention, a battery life prediction apparatus includes a storing unit storing a plurality of pieces of power pattern data used in an actual site, a pattern generating unit generating a test pattern for predicting a life of a battery based on the power pattern data, and a life predicting unit predicting a residual life of the battery based on the test pattern.

According another embodiment of the present invention, a battery life prediction method includes extracting at least one piece of power pattern data from a plurality of pieces of the power pattern data used in an actual site, generating a test pattern for predicting a life of a battery based on the extracted power pattern data, and predicting a residual life of the battery based on the test pattern.

Advantageous Effects

With a battery life prediction apparatus and method according to the present invention, by generating a test pattern to have a parameter value desired by a user based on power pattern data used in an actual site, a charging/discharging test may be conducted through a power pattern that is similar to the actual site, thereby improving the accuracy of battery residual rate prediction of the actual site.

BRIEF DESCRIPTION OF THE DRAWINGS

FIG. 4 illustrates a parameter value of a test pattern actually generated in a battery life prediction apparatus according to an embodiment of the present invention, and a target parameter value.

MODE FOR CARRYING OUT THE INVENTION

Figure 1:
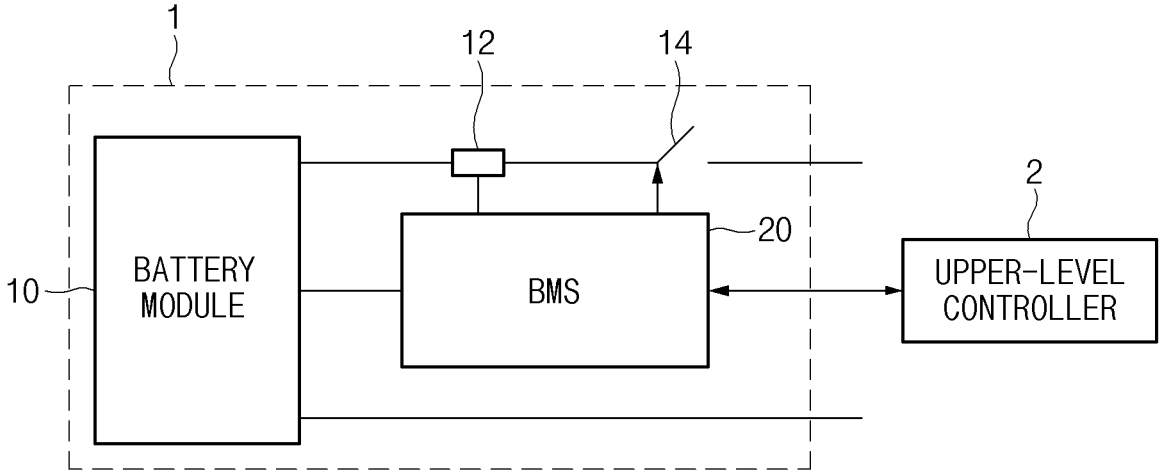
FIG. 1 is a block diagram of a general battery pack.

Hereinafter, various embodiments of the present invention will be described in detail with reference to the accompanying drawings. In this document, the same reference numerals are used for the same components in the drawings, and a redundant description of the same components may be omitted.

For various embodiments of the present invention disclosed in this document, specific structural or functional descriptions are only exemplified for the purpose of describing the embodiments of the present invention, and various embodiments of the present invention may be implemented in various forms, and should not be construed as being limited to the embodiments described in this document.

As used in various embodiments, the terms "$1^{st}$", "$2^{nd}$", "first", "second", or the like may modify various components regardless of importance, and do not limit the components. For example, a first component may be named as a second component without departing from the right scope of the present disclosure, and similarly, the second component may be named as the first component.

Terms used in the present document are used for only describing a specific exemplary embodiment of the disclosure and may not have an intention to limit the scope of other exemplary embodiments of the disclosure. It is to be understood that the singular forms include plural references unless the context clearly dictates otherwise.

All of the terms used herein including technical or scientific terms have the same meanings as those generally understood by an ordinary skilled person in the related art. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some cases, the terms defined herein may be interpreted to exclude embodiments of the present disclosure.

FIG. 1 is a block diagram of a general battery pack.

Referring to FIG. 1, a battery control system including a battery rack 1 and a upper-level controller 2 included in a upper-level system according to an embodiment of the present invention is schematically shown.

As shown in FIG. 1, the battery rack 1 may include a battery module 10 that includes one or more battery cells and is chargeable/dischargeable, a switching unit 14 serially connected to a positive (+) terminal side or a negative (−) terminal side of the battery module 10 to control a charging/discharging current flow of the battery module 10, and a battery management system (e.g., MBMS) 20 for control and management to prevent over-charging and over-discharging by monitoring voltage, current, temperature, etc., of the battery rack 1. The battery rack 1 may include a plurality of battery modules 10, sensors 12, switching units 14, and battery management systems 20.

Herein, as the switching unit 14 which is a semiconductor switching element for controlling a current flow for charging or discharging of the plurality of battery modules 10, for example, at least one MOSFET, relay, magnetic contactor, etc., may be used according to specifications of the battery rack 1.

The battery management system 20 may measure or calculate voltage and current of a gate, a source, a drain, etc., of the semiconductor switching element to monitor voltage, current, temperature, etc., of the battery rack 1. The battery management system 20 may measure current, voltage, temperature, etc., of the battery rack 1 by using the sensor 12 provided adjacent to the semiconductor switching element.

The battery management system 20, which is an interface for receiving measurement values of the above-described various parameter values, may include a plurality of terminals and a circuit, etc., connected thereto to process input values. The battery management system 20 may control ON/OFF of the switching unit 14, e.g., the MOSFET, and may be connected to the battery module 10 to monitor a state of each battery module 10.

Meanwhile, the battery management system 20 according to the present invention may generate a test pattern for predicting the residual rate (life) of the battery based on power pattern data in the actual site as will be described below. Based on the test pattern, the residual life of the battery may be predicted.

The upper-level controller 2 may transmit a control signal regarding the battery module 10 to the battery management system 20. Thus, the battery management system 20 may also be controlled in terms of an operation thereof based on a signal applied from the upper-level controller. Meanwhile, the battery cell according to the present invention may be included in the battery module 10 used for an energy storage system (ESS). In this case, the upper-level controller 2 may be an ESS controller. However, the battery rack 1 is not limited to such a purpose.

Such configurations of the battery rack 1 and the battery management system 20 are well-known configurations, and thus will not be described in detail.

Figure 2:
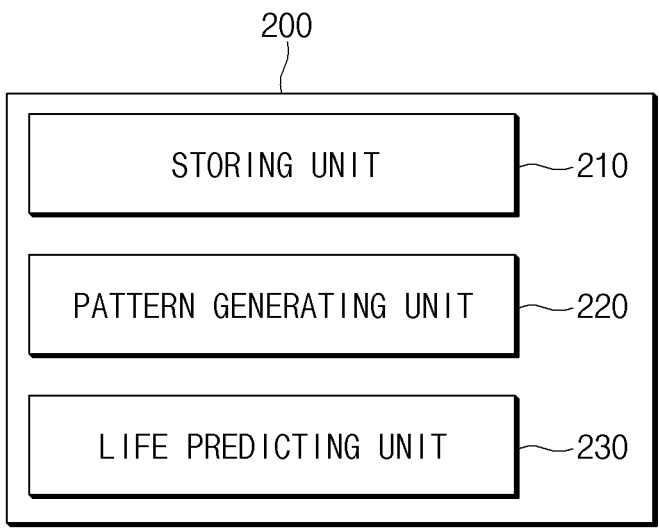
FIG. 2 is a block diagram showing a structure of a battery life prediction apparatus according to an embodiment of the present invention.

FIG. 2 is a block diagram showing a structure of a battery life prediction apparatus according to an embodiment of the present invention.

Referring to FIG. 2, a battery life prediction apparatus 200 according to an embodiment of the present invention may include a storing unit 210, a pattern generating unit 220, and a life predicting unit 230.

The storing unit 210 may store a plurality of pieces of power pattern data used in the actual site. In this case, the power pattern data stored in the storing unit 210 may include a power pattern actually used in a power system. For example, the power pattern actually used in the power system, which is a frequency regulation (FR) power pattern, may include a Pacific Northwest National Laboratory (PNNL) pattern.

The pattern generating unit 220 may generate a test pattern for predicting the life of the battery based on the power pattern data stored in the storing unit 210. In this case, the pattern generating unit 220 may generate the test pattern to have a target parameter value regarding charging and discharging of the battery. In this case, the target parameter value may be a value input by the user, and for example, the target parameter value may include maximum/minimum state of energy (SOE), first/last SOE, and average CP (charging/discharging strength) in the entire period (e.g., 24 hours) of power pattern data. However, the target parameter value is not limited thereto, and various parameter values for defining a charging/discharging pattern of the battery may also be used.

The pattern generating unit 220 may repeatedly generate a test pattern until a difference between a parameter value of the generated test pattern and a target parameter value becomes less than a preset reference value. The reference value may be set by the user at random.

The pattern generating unit 220 may generate the test pattern by changing a scale of the power pattern data. More specifically, the pattern generating unit 220 may generate the test pattern by dividing the power pattern data into sections and adjusting a power value for each section. For example, the pattern generating unit 220 may divide the power pattern data into sections where similar patterns are shown. The pattern generating unit 220 may also generate the test pattern by multiplying a scaling value to each section to allow the test pattern to have the target parameter value.

The life predicting unit 230 may predict the residual life of the battery based on the test pattern. For example, when the test pattern generated in the pattern generating unit 220 and numeric values regarding the pattern are input to the life predicting unit 230, the life predicting unit 230 may conduct a charging/discharging test of the battery using a preset algorithm and predict the residual life of the battery.

Meanwhile, although not shown in FIG. 2, the battery life prediction apparatus 200 according to an embodiment of the present invention may include an input unit. Thus, the user may directly set a desired target parameter value, etc., through the input unit. For example, the input unit may include a keyboard, a touchpad, a mouse, etc.

Moreover, it is described with reference to FIG. 2 that a plurality of pieces of power pattern data used in the actual site are stored in the storing unit 210, but the present invention is not limited thereto and such power pattern data may be stored in a database of an external server. In this case, the battery life prediction apparatus 200 according to an embodiment of the present invention may include a communicating unit (not shown) to receive the power pattern data from the external server therethrough and generate a test pattern based on the received power pattern data.

As such, with the battery life prediction apparatus according to the present invention, by generating a test pattern to have a parameter value desired by a user based on power pattern data used in the actual site, a charging/discharging test may be conducted through a power pattern that is similar to the actual site, thereby improving the accuracy of residual rate prediction of the actual site.

Figure 3:
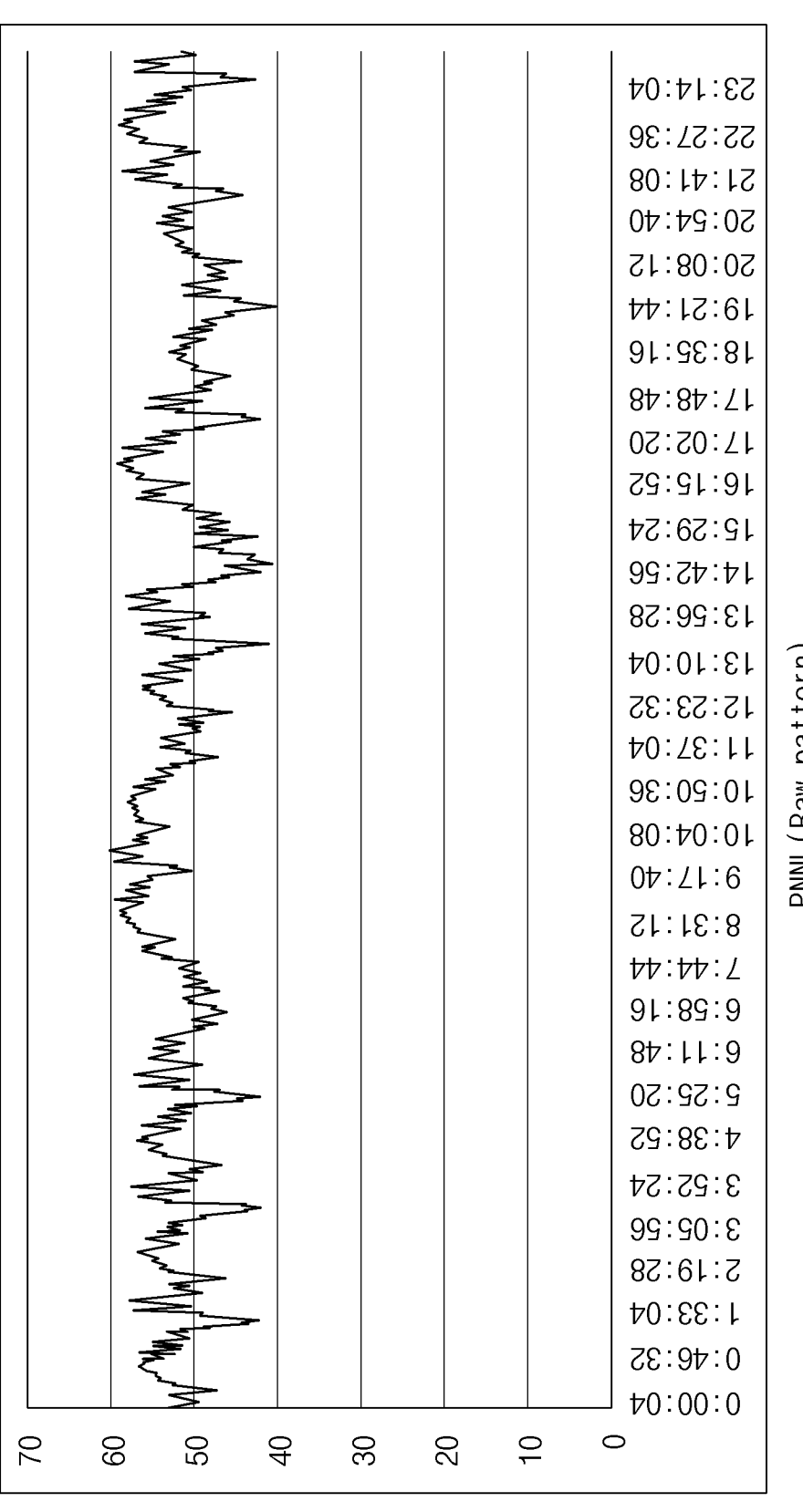
FIG. 3 illustrates actual PNNL pattern data used in a battery life prediction apparatus according to an embodiment of the present invention.

FIG. 3 illustrates actual PNNL pattern data used in a battery life prediction apparatus according to an embodiment of the present invention. Referring to FIG. 3, an x axis indicates time (hour/minute/second) and a y axis indicates SOE (%).

A PNNL pattern of FIG. 3 is a power pattern actually used in the power market of Europe. Herein, the PNNL pattern may be a power pattern indicating that charging and discharging are performed in a power source device such as a battery, etc., for 24 hours. As shown in FIG. 3, the PNNL pattern actually used in the site may appear in the form of being repeated in the unit of a certain time.

Meanwhile, the PNNL pattern of FIG. 3 is an example, and the PNNL pattern used in the battery life prediction apparatus according to an embodiment of the present invention is not limited to the illustration of FIG. 3. Various pieces of power pattern data used in the actual power market as well as the PNNL pattern may be used.

FIG. 4 illustrates a parameter value of a test pattern actually generated in a battery life prediction apparatus according to an embodiment of the present invention, and a target parameter value.

Referring to FIG. 4, it is illustrated that the battery life prediction apparatus according to an embodiment of the present invention generates a test pattern by using a sampling time of 4 seconds. As shown in FIG. 4, target parameter values may be calculated for maximum/minimum SOE, first/last SOE, and average CP.

In FIG. 4, a normalized value and a scale-changed value are calculation values used to generate the test pattern in the battery life prediction apparatus according to an embodiment of the present invention. Referring to FIG. 4, it may be seen that target parameter values are maximum/minimum SOE of 80% and 20%, respectively, first/last SOE of 50%, respectively, and average CP of 0.5000 (1/hr). Such target parameter values may be input directly by the user.

Meanwhile, parameter values of a test pattern generated to be target parameter values by the battery life prediction apparatus according to an embodiment of the present invention may be maximum/minimum SOE of 82.08% and 20.44%, respectively, first/last SOE of 50% and 50.05%, respectively, and average CP of 0.5091 (1/hr), as shown in FIG. 4.

In this case, when each parameter value of the generated test pattern falls within a preset reference range from each target parameter value, the test pattern may be used to calculate the residual life of the battery. However, when one or more of the parameter values of the generated test pattern fall out of the preset reference range from the target parameter values, the test pattern may be generated until they fall within the reference range.

Figure 5:
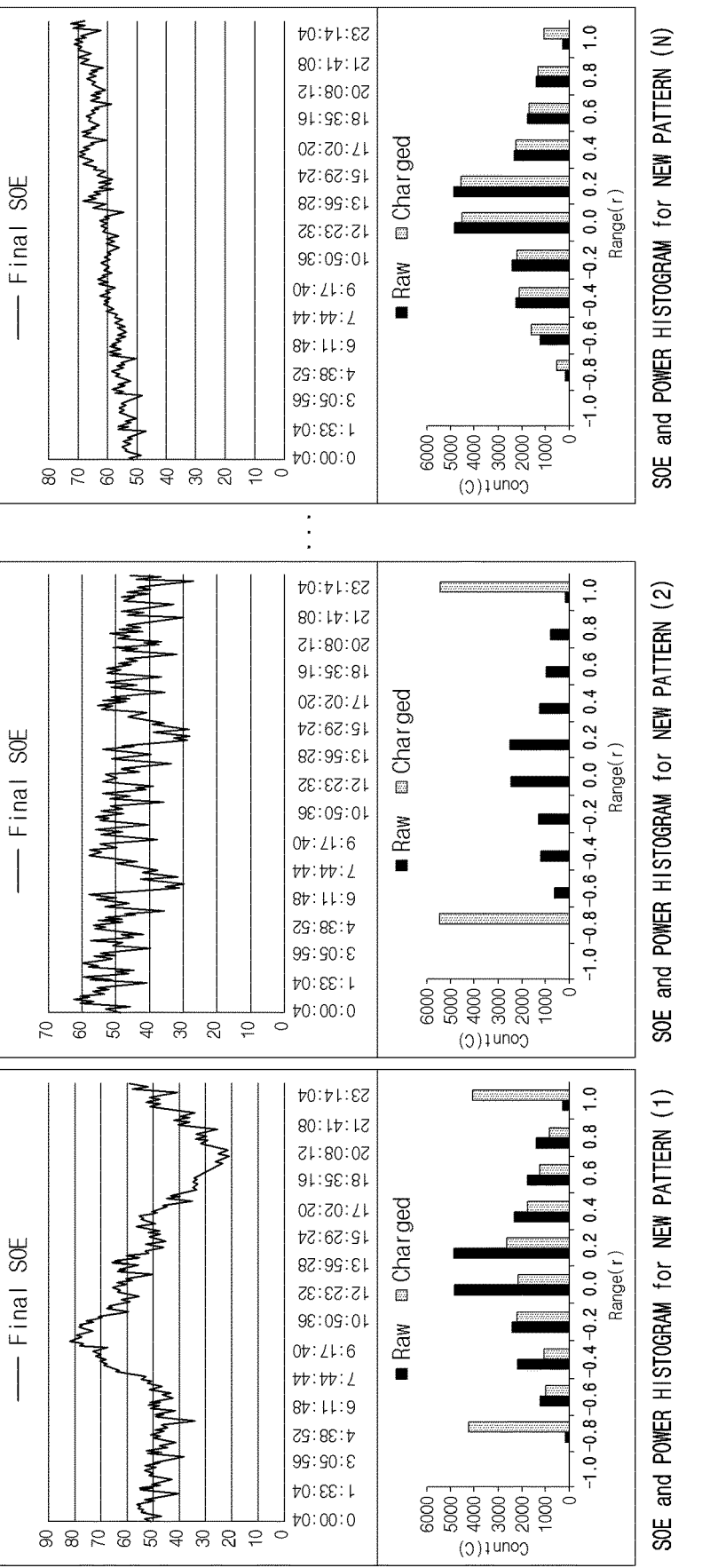
FIG. 5 illustrates parameter value a test pattern generated in a battery life prediction apparatus according to an embodiment of the present invention, and a power histogram.

FIG. 5 illustrates a test pattern generated in a battery life prediction apparatus according to an embodiment of the present invention, and a power histogram.

In FIG. 5, upper graphs are graphs showing a generated test pattern where an x axis indicates time (hour/minute/second) and a y axis indicates SOE (%). Lower graphs of FIG. 5 are power histograms for the generated test pattern where an x axis indicates an SOE range and a y axis indicates the number of pieces of data for each SOE magnitude. In this case, each test pattern of FIG. 5 may be generated using the PNNL pattern data of FIG. 3.

As shown in FIG. 5, it may be seen that even when the same PNNL pattern data of FIG. 3 is used, various test patterns may be generated. That is, after the PNNL pattern data of FIG. 3 is divided into several sections depending on similar patterns, scaling (e.g., repetitive multiplication of a specific value to a power value of each section) may be performed to have a target parameter value for each section, thereby variously expressing a form of a test pattern.

Figure 6:
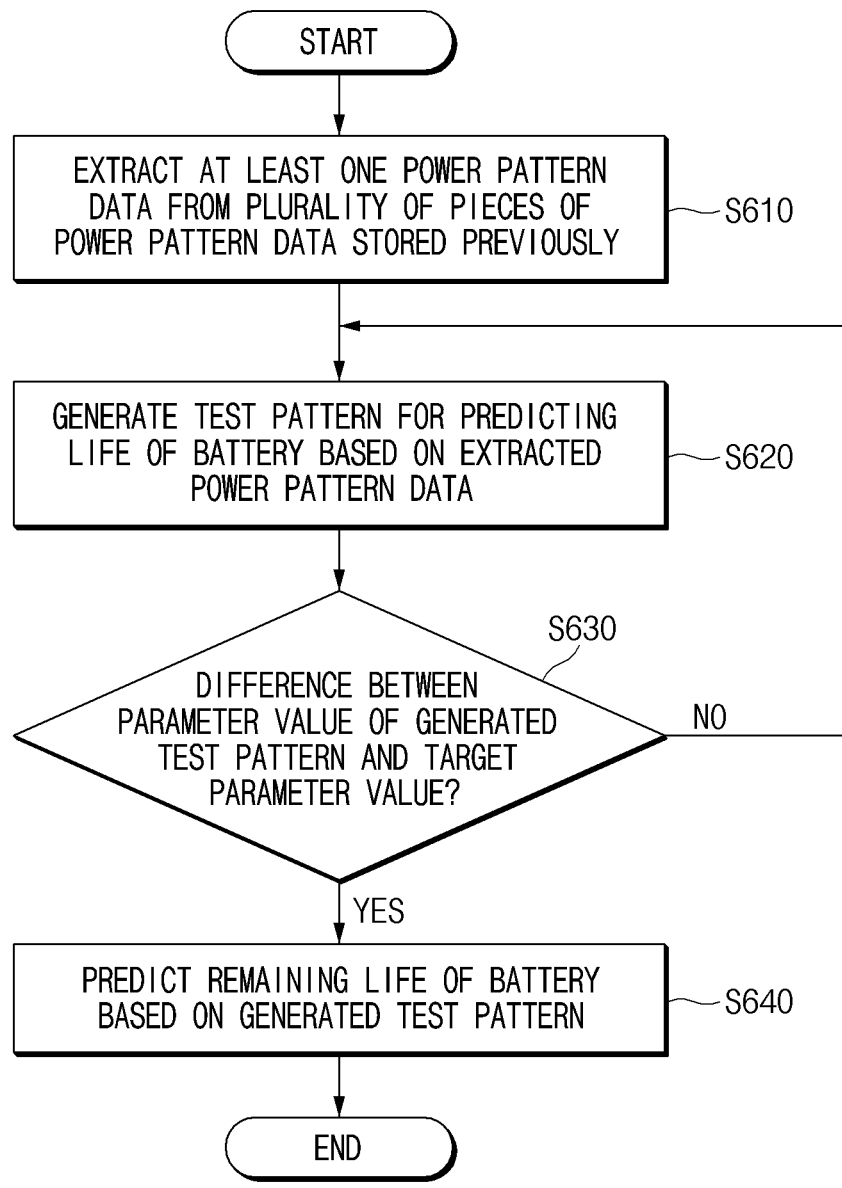
FIG. 6 is a flowchart showing a battery life prediction method according to an embodiment of the present invention.

FIG. 6 is a flowchart showing a battery life prediction method according to an embodiment of the present invention.

Referring to FIG. 6, a battery life prediction method according to an embodiment of the present invention extracts at least one piece of power pattern data from among a plurality of pieces of power pattern data stored in advance, in operation S610. In this case, the plurality of pieces of power pattern data may be stored in the above-described storing unit or external server. In addition, the power pattern data may include a power pattern actually used in a power system. For example, the power pattern actually used in the power system, which is an FR power pattern, may include a PNNL pattern.

A test pattern for predicting the life of the battery may be generated based on the extracted power pattern data, in operation S620. In this case, in operation S620, the test pattern may be generated to have a target parameter value regarding charging and discharging of the battery. In this case, the target parameter value may be a value input by the user, and for example, the target parameter value may include maximum/minimum SOE, first/last SOE, and average CP.

In operation 620, the test pattern may be generated by changing a scale of the power pattern data. More specifically, the test pattern may be generated by dividing the power pattern data into sections and adjusting a power value for each section. For example, the test pattern may be generated by multiplying a scaling value to each section to allow the test pattern to have the target parameter value.

Next, in operation S630, it is determined whether a difference between the parameter value of the generated test pattern and the target parameter value is less than a reference value. When the difference between the parameter value of the generated test pattern and the target parameter value is greater than or equal to the reference value (No), the battery life prediction method may go back to operation S620. That is, the test pattern may be repeatedly generated until the difference between the parameter value of the generated test pattern and the target parameter value becomes less than the preset reference value.

On the other hand, when the difference between the parameter value of the generated test pattern and the target parameter value is less than the reference value (Yes), the residual life of the battery may be predicted based on the generated test pattern, in operation S640. For example, when the test pattern generated in operation S620 and numeric values regarding the pattern are input, a charging/discharging test of the battery may be conducted using a preset algorithm and the residual life of the battery may be predicted.

As such, with the battery life prediction method according to the present invention, by generating a test pattern to have a parameter value desired by a user based on power pattern data used in an actual site, a charging/discharging test may be conducted through a power pattern that is similar to the actual site, thereby improving the accuracy of battery residual rate prediction of the actual site.

Figure 7:
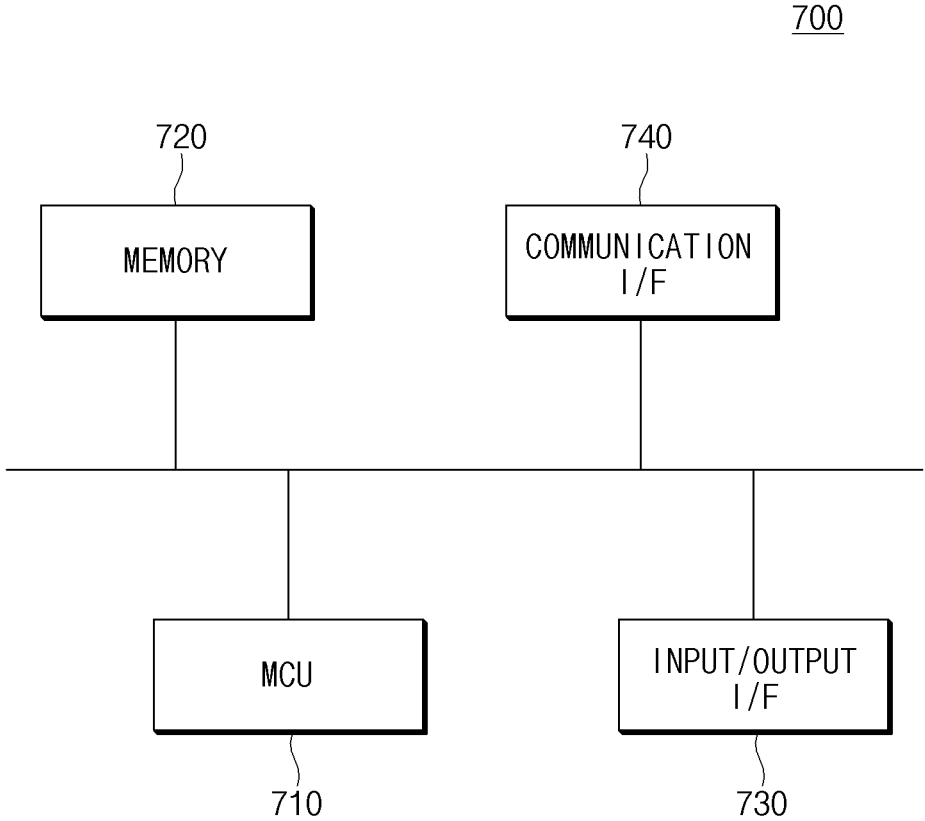
FIG. 7 is a block diagram showing a hardware structure of a battery life prediction apparatus according to an embodiment of the present invention.

FIG. 7 is a block diagram showing a hardware structure of a battery life prediction apparatus according to an embodiment of the present invention.

Referring to FIG. 7, a battery life prediction apparatus 700 according to an embodiment of the present invention may include a microcontroller unit (MCU) 710, a memory 720, an input/output interface (I/F) 730, and a communication I/F 740.

The MCU 710 may be a processor that executes various programs (e.g., a test pattern generation program, a battery life prediction program, etc.) stored in the memory 720, processes various data for generating the test pattern of the battery and predicting the life of the battery through these programs, and executes the above-described functions of FIG. 2.

The memory 720 may store various programs regarding test pattern generation, life prediction of the battery, etc. The memory 720 may store various data such as power pattern data (e.g., PNNL data), test pattern data, etc., used in the actual site.

The memory 720 may be provided in plural, depending on a need. The memory 720 may be a volatile or nonvolatile memory. For the memory 720 as the volatile memory, random access memory (RAM), dynamic RAM (DRAM), static RAM (SRAM), etc., may be used. For the memory 720 as the nonvolatile memory, read only memory (ROM), programmable ROM (PROM), electrically alterable ROM (EAROM), erasable PROM (EPROM), electrically erasable PROM (EEPROM), flash memory, etc., may be used. The above-listed examples of the memory 720 are merely examples and are not limited thereto.

The input/output I/F 730 may provide an interface for transmitting and receiving data by connecting an input device (not shown) such as a keyboard, a mouse, a touch panel, etc., and an output device such as a display (not shown), etc., with the MCU 710.

The communication I/F 740, which is a component capable of transmitting and receiving various data to and from a server, may be various types of devices capable of supporting wired or wireless communication. For example, a program or various data, etc., for generating power pattern data or a test pattern and predicting the life of the battery, may be transmitted and received to and from a separately provided external server through the communication I/F 740.

As such, a computer program according to an embodiment of the present invention may be recorded in the memory 720 and processed by the MCU 710, thus being implemented as a module that performs function blocks shown in FIG. 2.

Even though all components constituting an embodiment of the present invention have been described above as being combined into one or operating in combination, the present invention is not necessarily limited to the embodiment. That is, within the object scope of the present invention, all the components may operate by being selectively combined into one or more.

Moreover, terms such as "include", "constitute" or "have" described above may mean that the corresponding component may be inherent unless otherwise stated, and thus should be construed as further including other components rather than excluding other components. All terms including technical or scientific terms have the same meanings as those generally understood by those of ordinary skill in the art unless defined otherwise. The terms used generally like terms defined in dictionaries should be interpreted as having meanings that are the same as the contextual meanings of the relevant technology and should not be interpreted as having ideal or excessively formal meanings unless they are clearly defined in the present invention.

The above description is merely illustrative of the technical idea of the present invention, and various modifications and variations will be possible without departing from the essential characteristics of the present invention by those of ordinary skill in the art to which the present invention pertains. Therefore, the embodiments disclosed in the present invention are intended for description rather than limitation of the technical spirit of the present invention, and the scope of the technical spirit of the present invention is not limited by these embodiments. The protection scope of the present invention should be interpreted by the following claims, and all technical spirits within the same range should be understood to be included in the range of the present invention.

The invention claimed is:

1. A battery life prediction apparatus comprising:
a storing unit configured to store a plurality of pieces of power pattern data used in an actual site;
a pattern generating unit configured to generate a test pattern for predicting a life of a battery based on the power pattern data; and
a life predicting unit configured to predict a residual life of the battery based on the test pattern,
wherein the pattern generating unit generates the test pattern to have a target parameter value regarding charging and discharging of the battery, and
wherein the life predicting unit communicates the predicted residual life of the battery to a battery management system, and based on the predicted residual life of the battery, the battery management system controls an on or off of a switch connected to the battery.

2. The battery life prediction apparatus of claim 1, wherein the target parameter value is input by a user.

3. The battery life prediction apparatus of claim 1, wherein the target parameter value comprises at least one of maximum and minimum states of energy (SOE), first and last SOE, or an average charging/discharging strength (CP).

4. The battery life prediction apparatus of claim 1, wherein the pattern generating unit repeatedly generates the test pattern until a difference between a parameter value of the generated test pattern and the target parameter value becomes less than a preset reference value.

5. The battery life prediction apparatus of claim 1, wherein the pattern generating unit generates the test pattern by changing a scale of the power pattern data.

6. The battery life prediction apparatus of claim 5, wherein the pattern generating unit generates the test pattern by dividing the power pattern data into at least one section and adjusting a power value for each section.

7. The battery life prediction apparatus of claim 6, wherein the pattern generating unit generates the test pattern by multiplying a scaling value to each section to allow the test pattern to have the target parameter value regarding the charging and discharging of the battery.

8. The battery life prediction apparatus of claim 1, wherein the power pattern data comprises a power pattern actually used in a power system.

9. The battery life prediction apparatus of claim 8, wherein the power pattern actually used in the power system comprises a Pacific Northwest National Laboratory (PNNL) pattern.

10. A battery life prediction method comprising:

extracting at least one piece of power pattern data from a plurality of pieces of the power pattern data used in an actual site;

generating a test pattern for predicting a life of a battery based on the extracted power pattern data;

predicting a residual life of the battery based on the test pattern; and communicating the predicted residual life of the battery to a battery management system, and based on the predicted residual life of the battery, controlling, by the battery management system, an on or off of a switch connected to the battery, wherein the generating of the test pattern comprises generating a test pattern to have a target parameter value regarding charging and discharging of the battery.

11. The battery life prediction method of claim 10, wherein the generating of the test pattern comprises generating the test pattern by changing a scale of the power pattern data.

12. The battery life prediction method of claim 11, wherein the generating of the test pattern comprises generating the test pattern by dividing the power pattern data into sections and adjusting a power value for each section.

13. The battery life prediction method of claim 12, wherein the generating of the test pattern further comprises multiplying a scaling value to each section until the test pattern includes the target parameter value.

14. The battery life prediction method of claim 10, wherein the generating of the test pattern comprises repeatedly generating a test pattern until a difference between a parameter value of the generated test pattern and the target parameter value is less than a preset reference value.

15. The battery life prediction method of claim 14, wherein the preset reference value is set by a user.

16. The battery life prediction method of claim 10, wherein the predicting the residual life of the battery based on the test pattern comprises conducting a charging and discharging test of the battery.

* * * * *